US006307303B1

(12) United States Patent
Bechtold et al.

(10) Patent No.: US 6,307,303 B1

(45) Date of Patent: Oct. 23, 2001

(54) ULTRASOUND TRANSMITTING CONFIGURATION

(75) Inventors: Mario Bechtold, Röttenbach; Bernd Granz, Oberasbach; Hermann Hammerbacher, Bubenreuth; Hans-Peter Heindel, Fürth; Klaus Newerla, Nürnberg, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/360,474

(22) Filed: Jul. 23, 1999

(30) Foreign Application Priority Data

Jul. 23, 1998 (DE) ..................................... 198 33 213

(51) Int. Cl.[7] ..................................... H01L 41/08

(52) U.S. Cl. ..................................... 310/335; 310/334

(58) Field of Search ..................................... 310/334–337, 310/367, 368

(56) References Cited

U.S. PATENT DOCUMENTS

| | | | | |
|---|---|---|---|---|
| Re. 35,011 | * | 8/1995 | Wersing et al. | 310/334 |
| 3,971,962 | * | 7/1976 | Green | 310/335 X |
| 4,305,014 | * | 12/1981 | Borburgh et al. | 310/334 |
| 4,385,255 | * | 5/1983 | Yamaguchi et al. | 310/335 |
| 4,414,482 | * | 11/1983 | Lewis et al. | 310/334 |
| 4,440,025 | * | 4/1984 | Hayakawa et al. | 310/334 X |
| 5,103,129 | * | 4/1992 | Slayton et al. | 310/335 |
| 5,886,454 | * | 3/1999 | Ito et al. | 310/334 X |

FOREIGN PATENT DOCUMENTS

| | | |
|---|---|---|
| 2609425 | 2/1979 | (DE) . |
| 3807568A1 | 9/1989 | (DE) . |
| 19507478C1 | 5/1996 | (DE) . |

OTHER PUBLICATIONS

"Beam Steering of Shock Waves Using 30 cm Diameter Bidimensional Array", D. Cathignol et al., 1994 Ultrasonics Symposium, pp. 1801–1804.

* cited by examiner

*Primary Examiner*—Mark O. Budd
(74) *Attorney, Agent, or Firm*—Herbert L. Lerner; Laurence A. Greenberg; Werner H. Stemer

(57) ABSTRACT

An ultrasound transmitting configuration includes at least one ultrasound generating device for exposing a medium which has an acoustic medium impedance and a medium speed of sound to ultrasonic waves. The ultrasound generating device has at least two ultrasound transducers which can be excited through actuating electrodes for emitting ultrasound and which have an acoustic transducer impedance. The ultrasound transducers are separated from one another and disposed alongside one another. An ultrasound lens which has an acoustic lens impedance and a lens speed of sound is disposed between the ultrasound generating device and the medium. The ultrasound generating device is acoustically coupled on a coupling side to the ultrasound lens. The ultrasound transducers extend toward the medium over a transducer depth, they extend toward one another over a transducer width, and they extend at right angles to both the transducer depth and the transducer width over a transducer length. The transducer width is maximally as great as the transducer depth, and the transducer length is considerably greater than the transducer depth. The ultrasound transducers are associated with a common actuating element for actuating the ultrasound transducers jointly and in the same way.

10 Claims, 1 Drawing Sheet

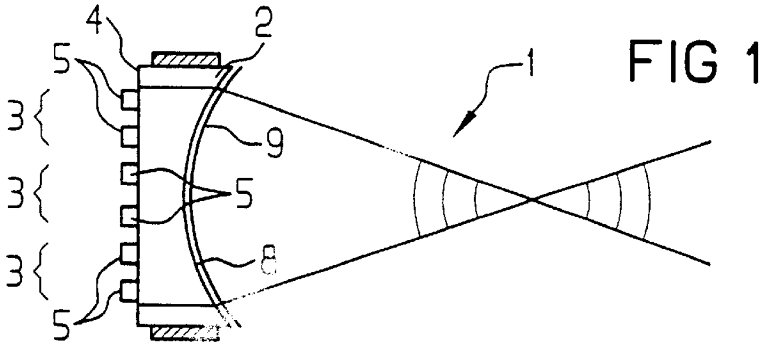
FIG 1
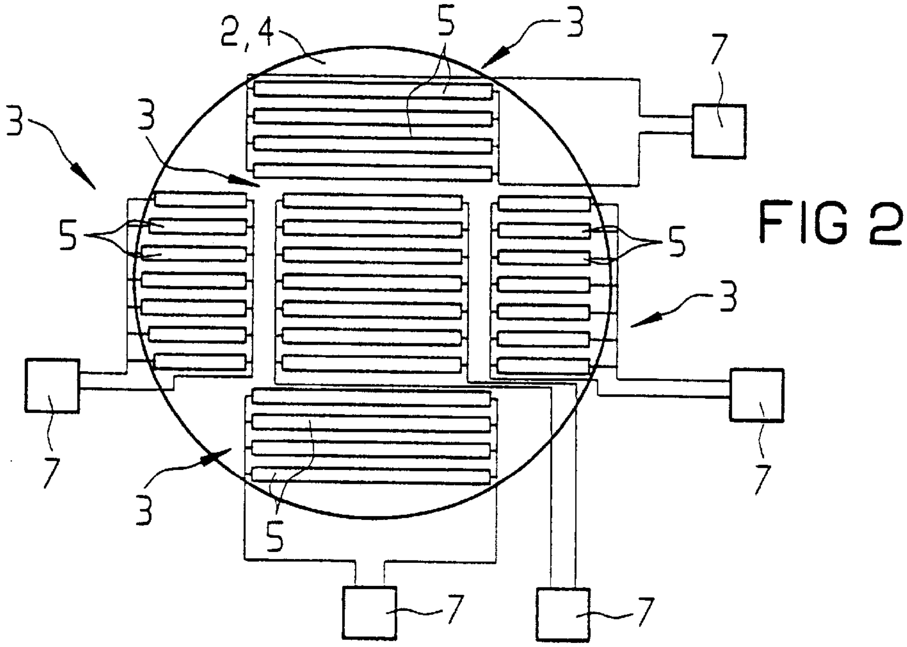
FIG 2
FIG 3
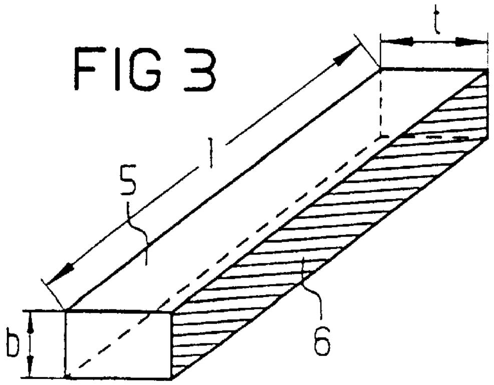

ULTRASOUND TRANSMITTING CONFIGURATION

BACKGROUND OF THE INVENTION

FIELD OF THE INVENTION

The present invention relates to an ultrasound transmitting configuration including at least one ultrasound generating device for exposing a medium which has an acoustic medium impedance and a medium speed of sound to ultrasonic waves. The ultrasound generating device has at least two ultrasound transducers which can be excited through actuating electrodes in order to emit ultrasound and which have an acoustic transducer impedance. The ultrasound transducers are separated from one another and disposed alongside one another. An ultrasound lens having an acoustic lens impedance and a lens speed of sound is disposed between the ultrasound generating device and the medium. The ultrasound generating device is acoustically coupled on a coupling side to the ultrasound lens.

Such an ultrasound transmitting configuration is disclosed in German Published, Prosecuted Patent Application 26 09 425.

German Published, Non-Prosecuted Patent Application DE 38 07 568 A1 discloses an ultrasound transmitting configuration for exposing a medium which has an acoustic medium impedance and a medium speed of sound to ultrasonic waves through the use of at least one ultrasound generating device. The ultrasound generating device has at least two ultrasound transducers which can be excited through common actuating electrodes in order to emit ultrasound and which have an acoustic transducer impedance. The ultrasound transducers are separated from one another and disposed alongside one another. An ultrasound lens having an acoustic lens impedance and a lens speed of sound is disposed between the ultrasound generating device and the medium. The ultrasound generating device is acoustically coupled on a coupling side to the ultrasound lens. The ultrasound transducers are associated with a common actuating element.

German Patent DE 195 07 478 C1 discloses an ultrasound transmitting configuration for exposing a medium which has an acoustic medium impedance and a medium speed of sound to ultrasonic waves through the use of at least one ultrasound generating device. The ultrasound generating device has at least two ultrasound transducers which can be excited through actuating electrodes in order to emit ultrasound and which have an acoustic transducer impedance. The ultrasound transducers are separated from one another. An ultrasound lens having an acoustic lens impedance and a lens speed of sound is disposed between the ultrasound generating device and the medium. The ultrasound generating device is acoustically coupled on a coupling side to the ultrasound lens.

A scientific paper entitled "Beam Steering of Shock Waves Using 30 cm Diameter Bidimensional Array", in the 1994 IEEE Ultrasonics Symposium Proceedings, p. 1801–1804, by D. Cathignol and A. Birer, discloses an ultrasound transmitting configuration for exposing a medium which has an acoustic medium impedance and a medium speed of sound to ultrasonic waves through the use of an ultrasound generating device. The ultrasound generating device has at least two ultrasound transducers which can be excited through actuating electrodes in order to emit ultrasound and which have an acoustic transducer impedance. The ultrasound transducers are separated from one another.

The efficiency of the ultrasound transmitting configurations in the prior art is relatively low. Furthermore, the actuation of the ultrasound transmitting configuration is frequently very complex, due to the large number of ultrasound transducers to be actuated.

SUMMARY OF THE INVENTION

It is accordingly an object of the invention to provide an ultrasound transmitting configuration, which overcomes the hereinafore-mentioned disadvantages of the heretofore-known devices of this general type, which has improved efficiency for conversion of electrical energy into ultrasound energy and which at the same time has simplified acoustic coupling.

With the foregoing and other objects in view there is provided, in accordance with the invention, an ultrasound transmitting configuration, comprising at least one ultrasound generating device for exposing a medium having an acoustic medium impedance and a medium speed of sound to ultrasonic waves, the at least one ultrasound generating device having a coupling side, and the at least one ultrasound generating device including at least two mutually separated ultrasound transducers disposed alongside one another and having an acoustic transducer impedance; actuating electrodes for exciting the at least two ultrasound transducers to emit ultrasound; an ultrasound lens acoustically coupled to the coupling side of the at least one ultrasound generating device, the ultrasound lens disposed between the at least one ultrasound generating device and the medium, and the ultrasound lens having an acoustic lens impedance and a lens speed of sound; the ultrasound transducers extending over a transducer depth toward the medium, extending toward one another over a transducer width, and extending at right angles to the transducer depth as well as to the transducer width over a transducer length, the transducer width being at most as great as the transducer depth, and the transducer length being greater than the transducer depth; and a common actuating element associated with the ultrasound transducers, for actuating the ultrasound transducers jointly and in the same way.

In accordance with another feature of the invention, the efficiency for conversion of electrical energy to ultrasound energy is particularly high if the ratio of the transducer width to the transducer depth is between 0.5 and 0.7.

In accordance with a further feature of the invention, if the ratio of the transducer length to the transducer depth is at least 5.0, and is preferably at least 10.0, a relatively large-area ultrasound generating device can be produced with a small number of ultrasound transducers.

In accordance with an added feature of the invention, if the ultrasound transducers are connected directly to the ultrasound lens, this results in particularly good and simple coupling of the ultrasound transducers to the ultrasound lens.

In accordance with an additional feature of the invention, the mechanical construction of the ultrasound transmitting configuration is particularly simple if the ultrasound lens is constructed as a supporting element for the ultrasound transducers.

In accordance with yet another feature of the invention, a particularly large proportion of the ultrasound power emitted by the ultrasound transducers can be coupled into the ultrasound lens, if the lens impedance is between one third of the transducer impedance and the transducer impedance.

In accordance with yet a further feature of the invention, the lens speed of sound is greater than the medium speed of sound.

In accordance with a concomitant feature of the invention, the ultrasound lens is fitted on an emission side, which is opposite the coupling side, with at least one matching layer for matching the lens impedance to the medium impedance, in a similar way to a heat-treated optical lens. In this way, a particularly high proportion of the ultrasound can be coupled into the medium.

Other features which are considered as characteristic for the invention are set forth in the appended claims.

Although the invention is illustrated and described herein as embodied in an ultrasound transmitting configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, side-elevational view of an ultrasound transmitting configuration;

FIG. 2 is an enlarged, coupling side-elevational view of the ultrasound transmitting configuration of FIG. 1; and FIG. 3 is a further enlarged, perspective view of an ultrasound transducer.

DESCRIPTION OF THE PREFERRED EMBODIMENTS

Referring now to the figures of the drawings in detail and first, particularly, to FIG. 1 thereof, there is seen a medium 1 which is intended to be exposed to ultrasonic waves. The medium 1 has an acoustic medium impedance and a medium speed of sound. The medium 1 is exposed to ultrasonic waves by an ultrasound transmitting configuration, which has an ultrasound lens 2 and ultrasound generating devices 3. The ultrasound lens 2 has an acoustic lens impedance and a lens speed of sound. The ultrasound lens 2 is disposed between the ultrasound generating devices 3 and the medium 1. The ultrasound generating devices 3 are acoustically coupled on a coupling side 4 to the ultrasound lens 2.

The ultrasound generating devices 3 each have at least two ultrasound transducers 5, which will be described in more detail below. According to FIG. 1, the ultrasound transducers 5 are connected directly to the ultrasound lens 2. The ultrasound lens 2 is constructed as a supporting element for the ultrasound transducers 5.

According to FIG. 2, there are five ultrasound generating devices 3, namely one disposed in the center and four disposed peripherally around the one in the center. As can be seen, each of the ultrasound generating devices 3 has a plurality of ultrasound transducers 5. The ultrasound transducers 5 have an acoustic transducer impedance and can be excited to emit ultrasound through actuating electrodes 6, which are shown in FIG. 3. The ultrasound transducers 5 are furthermore separated from one another, as can be seen. The actuating electrodes 6 of different ultrasound transducers 5 are also physically separated from one another.

According to FIG. 3, the ultrasound transducers 5 extend over a transducer depth t toward the medium 1. The ultrasound transducers 5 extend in a width direction over a transducer width b at right angles to the depth t. The ultrasound transducers 5 extend over a transducer length l at right angles to these two directions t and b. A polarization of the ultrasound transducer 5, which is normally in the form of a piezo element, is parallel to the depth direction.

The transducer width b is, at a maximum, as great as the transducer depth t. Normally, it is between 50% and 70% of the transducer depth t. The transducer length l is considerably greater than the transducer depth t. The transducer length l is normally at least five times, and preferably at least ten times, as great as the transducer depth t. Typical dimensions for the ultrasound transducers 5 are, for example, t=1 mm, b=0.6 mm and l=20 mm to 50 mm.

According to FIG. 2, the ultrasound transducers 5 of each ultrasound generating device 3 are disposed alongside one another, as seen in the width direction. The ultrasound transducers 5 of each ultrasound generating device 3 are each assigned a common actuating element 7. All of the ultrasound transducers 5 in an ultrasound generating device 3 are actuated jointly and in the same way through the use of the actuating elements 7. The actuating complexity is consequently kept within narrow limits.

In order to ensure particularly good coupling of the ultrasound emitted by the ultrasound transducers 5 into the ultrasound lens 2, the lens impedance is between one third of the transducer impedance and the transducer impedance. In order to achieve particularly good coupling of the ultrasound from the ultrasound lens 2 into the medium 1, at least one matching layer 9 is fitted to the ultrasound lens 2 on an emission side 8 which is opposite to the coupling side 4. The matching layer 9 allows the lens impedance to be matched to the medium impedance. The ultrasound lens 2 is, furthermore, produced from a material having a lens speed of sound which is greater than the medium speed of sound.

The ultrasound transmitting configuration according to the invention results, on one hand, in high efficiency for the conversion of electrical excitation energy into emitted ultrasound energy. On the other hand, it provides simple and good coupling of the ultrasound energy into the medium 1. The use of ultrasound transducers 5 in the form of rods with the above dimensions furthermore results in the acoustic impedance of the ultrasound transducers 5 being reduced by about 20%. This impedance falls from about 35 MRayl to about 28 MRayl. The focus point and/or the depth of focus of the ultrasound can also be varied by selectively actuating only the central ultrasound generating device 3 or all of the ultrasound generating devices 3, possibly also with a phase offset.

We claim:

1. An ultrasound transmitting configuration for transmitting ultrasound, comprising:

a plurality of ultrasound generating devices for exposing a medium having an acoustic medium impedance and a medium speed of sound to ultrasonic waves, said plurality of ultrasound generating devices having a coupling side, and each of said plurality of ultrasound generating devices including at least two mutually separated ultrasound transducers disposed alongside one another and having an acoustic transducer impedance;

actuating electrodes for exciting said at least two ultrasound transducers to emit ultrasound;

an ultrasound lens acoustically coupled to said coupling sides of said plurality of ultrasound generating devices, said ultrasound lens disposed between said plurality of ultrasound generating devices and the medium, and said ultrasound lens having a center, an acoustic lens impedance, a lens speed of sound, and an adjustable depth of focus;

one of said plurality of ultrasound generating devices being disposed in said center of said ultrasound lens and the others of said plurality of ultrasound generating devices being disposed peripherally around said one in said center;

said ultrasound transducers directly connecting to said ultrasound lens and extending over a transducer depth toward the medium, extending toward one another over a transducer width, and extending at right angles to said transducer depth as well as to said transducer width over a transducer length, said transducer width being at most as great as said transducer depth, and said transducer length being greater than said transducer depth; and a common actuating element connected to said plurality of ultrasound generating devices through said ultrasound transducers, said common actuating element adjusting said depth of focus by actuating said one ultrasound generating device in said center or said plurality of ultrasound generating devices.

2. The ultrasound transmitting configuration according to claim 1, wherein a ratio of said transducer width to said transducer depth is between 0.5 and 0.7.

3. The ultrasound transmitting configuration according to claim 1, wherein a ratio of said transducer length to said transducer depth is at least 5.0.

4. The ultrasound transmitting configuration according to claim 1, wherein a ratio of said transducer length to said transducer depth is at least 10.0.

5. The ultrasound transmitting configuration according to claim 2, wherein a ratio of said transducer length to said transducer depth is at least 5.0.

6. The ultrasound transmitting configuration according to claim 2, wherein a ratio of said transducer length to said transducer depth is at least 10.0.

7. The ultrasound transmitting configuration according to claim 1, wherein said ultrasound lens is a supporting element for said ultrasound transducers.

8. The ultrasound transmitting configuration according to claim 1, wherein said lens impedance is between said transducer impedance and one third of said transducer impedance.

9. The ultrasound transmitting configuration according to claim 1, wherein said lens speed of sound is greater than said medium speed of sound.

10. The ultrasound transmitting configuration according to claim 1, wherein said ultrasound lens has an emission side opposite said coupling side, and at least one matching layer is applied to said emission side for match said lens impedance to said medium impedance.

* * * * *